(12) United States Patent
Light et al.

(10) Patent No.: US 6,825,552 B2
(45) Date of Patent: Nov. 30, 2004

(54) CONNECTION COMPONENTS WITH ANISOTROPIC CONDUCTIVE MATERIAL INTERCONNECTION

(75) Inventors: David Light, Los Gatos, CA (US); Paula Lagattuta Tostado, San Jose, CA (US); Michael Warner, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/139,169

(22) Filed: May 6, 2002

(65) Prior Publication Data

US 2003/0068906 A1 Apr. 10, 2003

Related U.S. Application Data

(60) Provisional application No. 60/289,718, filed on May 9, 2001.

(51) Int. Cl.[7] ............................................. H01L 23/48
(52) U.S. Cl. ...................... 257/687; 257/690; 257/774; 257/777
(58) Field of Search ................................. 257/687, 690, 257/774, 777, 696; 439/55, 63

(56) References Cited

U.S. PATENT DOCUMENTS

| | | |
|---|---|---|
| 4,729,809 A | 3/1988 | Dery et al. |
| 4,811,081 A | 3/1989 | Lyden |
| 4,955,132 A | 9/1990 | Ozawa |
| 5,001,542 A | 3/1991 | Tsukagoshi et al. |
| 5,128,831 A | 7/1992 | Fox, III et al. |
| 5,148,265 A | 9/1992 | Khandros et al. |
| 5,148,266 A | 9/1992 | Khandros et al. |
| 5,161,090 A | 11/1992 | Crawford et al. |
| 5,216,278 A | 6/1993 | Lin et al. |
| 5,225,966 A | 7/1993 | Basavanhally et al. |
| 5,347,159 A | 9/1994 | Khandros et al. |
| 5,360,992 A | 11/1994 | Lowrey et al. |
| 5,428,190 A | 6/1995 | Stopperan |
| 5,431,571 A | 7/1995 | Hanrahan et al. |
| 5,457,149 A | 10/1995 | Hall et al. |
| 5,518,964 A | 5/1996 | DiStefano et al. |
| 5,627,405 A | 5/1997 | Chillara |
| 5,631,191 A | 5/1997 | Durand et al. |
| 5,657,206 A | 8/1997 | Pedersen et al. |
| 5,677,576 A | 10/1997 | Akagawa |
| 5,679,977 A | 10/1997 | Khandros et al. |
| 5,685,885 A | 11/1997 | Khandros et al. |
| 5,749,997 A | 5/1998 | Tang et al. |
| 5,801,441 A | * 9/1998 | DiStefano et al. .......... 257/696 |
| 5,848,468 A | 12/1998 | Nann et al. |
| 5,852,326 A | 12/1998 | Khandros et al. |
| 5,861,678 A | 1/1999 | Schrock |
| 5,904,498 A | 5/1999 | Fjelstad |
| 5,933,712 A | 8/1999 | Bernhardt et al. |
| 5,989,936 A | 11/1999 | Smith et al. |
| 6,008,072 A | 12/1999 | Tang |
| 6,028,354 A | 2/2000 | Hoffman |

(List continued on next page.)

OTHER PUBLICATIONS

Office Action mailed Oct. 21, 2003 relating to application Ser. No. 10/205,635.

Microelectronics Packaging Handbook, Subsystem Packaging, Part III, 2nd Edition, Rao R. Tummala, Eugene J. Rymaszewski, Alan G. Klopfenstein, Oct. 16, 1997.

*Primary Examiner*—Cathy Lam
(74) *Attorney, Agent, or Firm*—Lerner, David, Littenberg, Krumholz & Mentlik, LLP

(57) ABSTRACT

A connection component for a microelectronic element includes a body of dielectric material having opposing first and second surfaces. A plurality of elongated leads extend through the body between the first and second surfaces. The leads have a first end accessible at the first surface and a second end accessible at the second surface. A layer of anisotropic conductive material overlies the first ends and the first surface of the body for electrical connection of the leads to a microelectronic element.

51 Claims, 4 Drawing Sheets

FIG. 13

U.S. PATENT DOCUMENTS

| | | | |
|---|---|---|---|
| 6,093,970 A | | 7/2000 | Ohsawa et al. |
| 6,104,087 A | * | 8/2000 | DiStefano et al. .......... 257/696 |
| 6,117,694 A | | 9/2000 | Smith et al. |
| 6,150,194 A | | 11/2000 | Sakaguchu |
| 6,265,765 B1 | * | 7/2001 | DiStefano et al. .......... 257/678 |
| 6,307,260 B1 | * | 10/2001 | Smith et al. ................. 257/696 |
| 6,333,207 B1 | * | 12/2001 | Light et al. ................. 438/106 |
| 6,372,527 B1 | | 4/2002 | Khandros et al. |
| 6,392,306 B1 | | 5/2002 | Khandros et al. |
| 6,468,830 B1 | * | 10/2002 | Carson ....................... 438/106 |

* cited by examiner

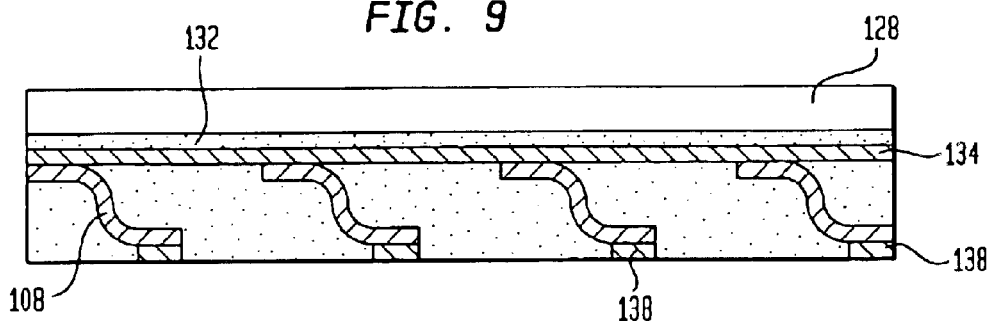
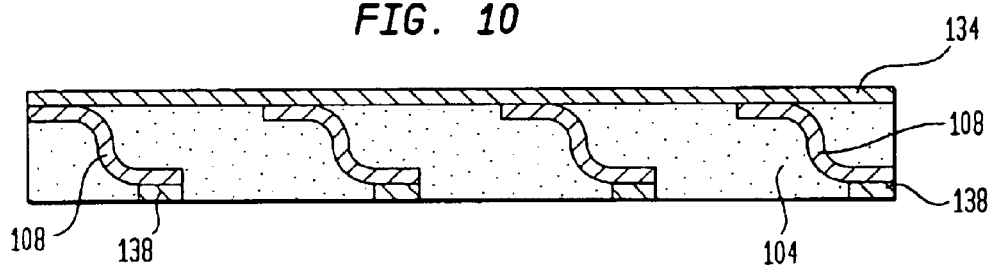
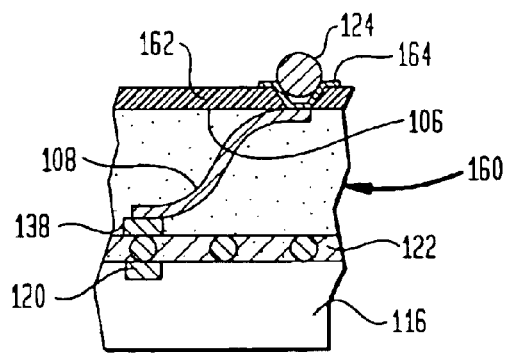
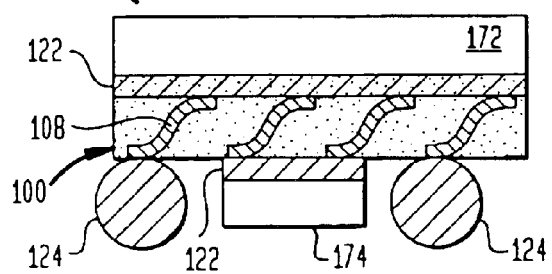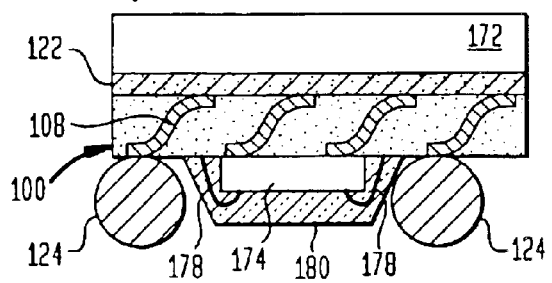

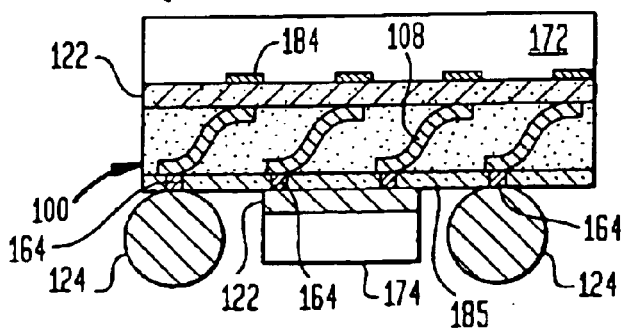
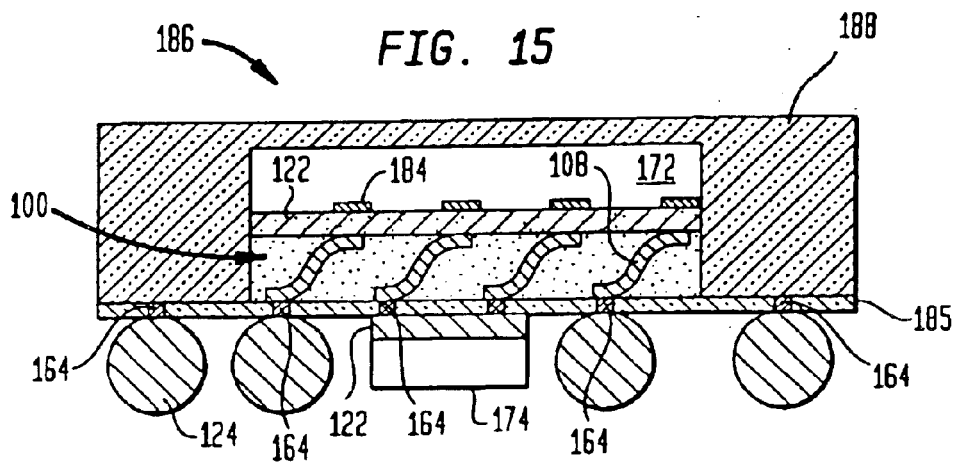
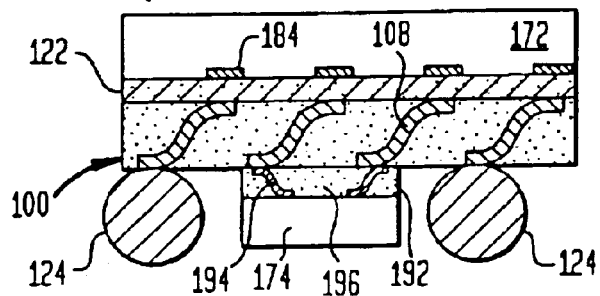
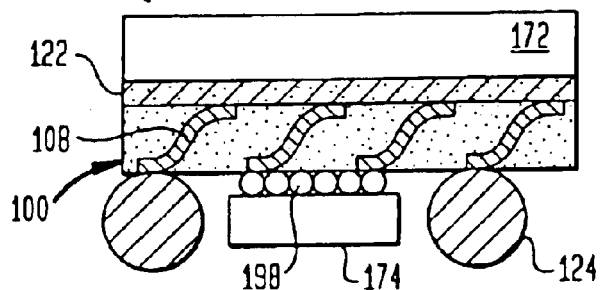

CONNECTION COMPONENTS WITH ANISOTROPIC CONDUCTIVE MATERIAL INTERCONNECTION

CROSS-REFERENCED RELATED APPLICATION

The present patent application claims priority to U.S. Provisional Application No. 60/289,718, filed May 9, 2001, which is incorporated herein by reference in its entirety. The present application is commonly assigned and copending with 10/205,635 which has a filing date of Jul. 25, 2002.

BACKGROUND OF THE INVENTION

The present invention relates in general to the field of microelectronic element mounting and connection, and more particularly, to connection components and semiconductor chip packages using anisotropic conductive adhesive material interconnection and to assembly methods therefor.

Microelectronic elements such as semiconductor chips are connected to external circuitry, such as the circuitry of a supporting substrate or circuit panel, through electrical contacts on the front face of the chip. Various processes for making these interconnections use prefabricated arrays of leads or discrete wires. For example, in tape automated bonding processes, a dielectric supporting tape such as a thin film of polyimide, includes an array of metallic leads on one surface of the dielectric film. The metallic leads are aligned with the contacts on the front face of the chip. The dielectric film is juxtaposed with the chip so that the leads extend over the front or contact bearing surface on the chip. The leads are then bonded to the contacts of the chip, as by ultrasonic or thermocompression bonding. The terminals on the dielectric film may then be connected to external circuitry for electrically interconnecting the chip and the external circuitry.

The evolution of the semiconductor art in recent years has created a continued demand for semiconductor chip packages having progressively greater numbers of contacts and leads in a given amount of space. An individual chip may require hundreds or even thousands of contacts, all within the area of the front face of the chip. Certain complex semiconductor chips currently being used have contacts spaced apart from one another at extremely small center-to-center distances. With such closely-spaced contacts the leads connected to the chip contacts must be extremely fine structures, typically having a smaller bonded surface than the contacts onto which they are bonded so that the adjacent leads do not electrically short.

In the bonding process of some assembly methods, the bonding region of each lead is engaged by a bonding tool which bears on the top surface of the lead in the bonding region and forces the lead downwardly into engagement with the contact. Energy supplied through the bonding tool causes the bonding metal to join with the contact. Typically, the leads are bonded to the chip contacts with the bonding tool using heat, force, ultrasonic energy, or a combination of two or more thereof, for a given time period. If incorrect force, heat and/or ultrasonic energy is used, the bond between the leads and the contacts may be too weak to withstand thermal cycling stresses during operation of the chip (heating and cooling cycles during operation). Also, the bonding tool may create areas of the lead which are prone to early fatigue during thermal cycling because of excessive non-uniform deformation in the bonding region, typically causing early breaks in the lead at the point the lead bends up from the chip surface.

In various microelectronic devices, it is also desirable to provide a connection between two components, which can accommodate relative movement between the components. For example, where a semiconductor chip is mounted to a circuit board, thermal expansion and contraction of the chip and circuit board can cause the contacts on the chip to move relative to the corresponding electrically conductive features of the circuit board. This can occur during service and can also occur during manufacturing operations as, for example, during soldering operations on the circuit board.

As illustrated in U.S. Pat. No. 5,518,964 ("the '964 Patent"), the disclosure of which is incorporated herein by reference, movable interconnections between elements such as a semiconductor chip and another element can be provided by first connecting leads between the elements and then moving the elements away from one another through a preselected displacement so as to bend the leads. For example, a connection component may incorporate a dielectric body and leads extending along a bottom surface of the dielectric body. The leads may have first or fixed ends permanently attached to the dielectric element and connected to electrically conductive features such as terminals, traces or the like on the dielectric body. The leads may also have second ends releasably attached to the dielectric body. The dielectric body, with the leads thereon, may be juxtaposed with the chip and the second ends of the leads may be bonded to contacts on the chip.

Following bonding, the dielectric body and chip are moved away from one another, thereby bending the leads towards a vertically extensive disposition. During or after movement, a curable material such as a liquid composition may be introduced between the elements. This may be cured to form a compliant dielectric layer such as an elastomer or gel surrounding the leads. The resulting packaged semiconductor chip has terminals on the dielectric body connection component which are electrically connected to the contacts on the chip but which can move relative to the chip to compensate for thermal effects. The packaged chip may be mounted to a circuit board by solder-bonding the terminals to conductive features on the circuit board. Relative movement between the circuit board and the chip due to thermal effects is taken up in the moveable interconnection provided by the leads and the compliant layer.

There is further disclosed in the '964 Patent a connector for use in making connections between two other microelectronic elements which is fabricated by a generally similar thus far described process. For example, in one embodiment a dielectric body having terminals and leads as discussed above is connected to terminal structures on a temporary sheet. The temporary sheet and dielectric body are moved away from one another so as to bend the leads, and a liquid material is introduced around the leads and cured to form a compliant layer between the temporary sheet and the dielectric body. The temporary sheet is then removed, leaving the tip ends of the terminal structures projecting from a surface of the compliant layer. Such a component may be used, for example, by engaging it between two other components. For example, the terminal structures may be engaged with a semiconductor chip, whereas the terminals on the dielectric body may be engaged with a circuit panel or other microelectronic component. Variation of the above described structures are disclosed in U.S. Pat. No. 6,117,694 ("the '694 Patent") the disclosure of which is incorporated herein by reference.

In copending U.S. patent application Ser. No. 09/237,072, filed Jan. 25, 1999 and entitled "Compliant Semiconductor Package With Anisotropic Conductive Material Interconnects and Methods Therefor" ("the '072 Application"), the disclosure of which is incorporated herein by reference, there is described a microelectronic package including a first microelectronic element having a front face including a plurality of contacts and a second microelectronic element including terminals accessible at a surface thereof and a plurality of flexible leads. Each of the flexible leads have a terminal end connected to one of the terminals and a tip end opposite the terminal end. Each flexible lead extends away from the second microelectronic element and is electrically interconnected with the plurality of contacts of the first microelectronic element. An anisotropic conductive material is interposed between each of the tip ends of the flexible leads and the contact associated therewith.

There is further described in the '072 Application a method of making a microelectronic package which includes providing a first microelectronic element having a front face including a plurality of contacts. An anisotropic conductive material is provided over each one of the plurality of contacts. A second microelectronic element is provided having terminals accessible at a surface thereof and including a plurality of flexible leads. Each of the leads has a terminal end attached to one of the terminals and a tip end offset from the terminal end. The first and second microelectronic elements are juxtaposed with one another. The tip ends of the flexible leads and the contacts are electrically interconnected so that the flexible leads extend away from the second microelectronic element with the anisotropic conductive material interposed between the tip ends and the contacts.

Akagawa, U.S. Pat. No. 5,677,576 discloses a semiconductor package including a semiconductor chip having one surface provided with an insulating passivation film having openings exposing aluminum contact pads formed on the surface of the semiconductor chip in a predetermined pattern. An anisotropic conductive sheet is formed over the passivation film and the contact pads. The anisotropic conductive sheet is formed of a resin containing conductive fillers such as metallic powders whereby the application of pressure to the film results in electrical conductivity in the pressed direction due to the continuity of the conductive fillers caused by the pressure. The metallic powders may be, for example, metallic particles in the nature of resin particles coated with nickel plated layers or the like or metallic particles such as of gold, nickel or the like.

Electrical conductive circuit patterns are formed in a predetermined arrangement on the exposed surface of the anisotropic conductive sheet. The circuit patterns are formed by adhering a metallic foil, such as a copper foil to the anisotropic conductive sheet and etching the foil in conformity with the predetermined circuit patterns. A photoresist film is deposited over the anisotropic conductive sheet and the circuit patterns. The photoresist film is provided with openings in the nature of via holes for receiving conductive bumps to provide external termination to the circuit patterns. By compressing the anisotropic conductive sheet in the region overlying the contact pads, electrical continuity to the circuit patterns is provided.

Tang, et al., U.S. Pat. No. 5,749,997 discloses another semiconductor device using an anisotropic conductive sheet. The device includes a semiconductor chip supporting on its major surface a plurality of composite bumps. The bumps are formed of a polymer body such as polyamic acid polyimide covered by a conductive metal coating such as a composite of chrome/gold or nickel/gold. An anisotropic conductive sheet is compressed over the composite bumps and the surface of the semiconductor chip. A dielectric layer having leads formed thereon such as in the conventional tape automated bonding process is arranged overlying the surface of the anisotropic conductive sheet. The leads may be fully supported by the dielectric sheet, or have portions extending within a window formed within the sheet. In either event, the dielectric sheet is arranged with the leads having one end overlying each of the composite bumps. Upon compression of the anisotropic conductive sheet, the conductive particles therein will make electrical contact with the leads and the conductive metal coating on the composite bumps.

Chillara, U.S. Pat. No. 5,627,405 discloses an anisotropic conductive sheet adhered to the surface of an integrated circuit semiconductor chip which includes a plurality of input/output terminals. The anisotropic conductive sheet is used to electrically couple the semiconductor chip directly to terminals on a printed circuit board, to leads of a lead frame, to traces on various substrate structures and the like.

Notwithstanding the foregoing known use of an anisotropic conductive sheet, there is still the need for improvements in microelectronic packages and methods of manufacturing same. In particular, there is the need for improvements in microelectronic packages which eliminate metal-to-metal bonding which is known to require the use of high temperature/pressures during thermocompression or thermosonic bonding. There is further the need for providing improved methods for making such microelectronic packages which will minimize deformation of the flexible leads thereby minimizing the potential for fatigue problems. Still further, there is the need for such microelectronic packages and methods for manufacturing same which provide for the use of narrow flexible leads which enables the obtaining of very fine pitches so as to accommodate more leads in a given space.

SUMMARY OF THE INVENTION

In accordance with one embodiment of the present invention there is described a connection component for a microelectronic element, the component comprising a body of dielectric material having opposing first and second surfaces, a plurality of elongated leads extending through the body between the first and second surfaces, the leads having a first end accessible at the first surface and a second end accessible at the second surface, and a layer of anisotropic conductive material overlying the first ends and the first surface of the body for electrical connection of the leads to a microelectronic element.

The aforesaid connection component wherein the dielectric material is flexible or rigid, wherein the first and second ends of the leads are offset from each other, and further including a plurality of contacts on the first surface in electrical contact with the first ends of the leads, wherein the plurality of contacts are formed from a portion of the first ends of the leads.

The anisotropic conductive material can be provided in the form of a paste or a preformed sheet, provided on the first surface of the body as an adhesive material.

The aforesaid connection component further including a layer of dielectric material on the second surface of the body, further including a plurality of conductors extending through the layer of dielectric material in electrical contact with the second ends of the leads, wherein the plurality of conductors comprise lined vias.

The aforesaid connection component wherein the layer of anisotropic conductive material is provided on the first surface of the body and the first ends of the leads, wherein the layer of anisotropic conductive material is provided on the second surface of the body and the second ends of the leads, and wherein the first ends are horizontally displaced from the second ends.

In accordance with another embodiment of the present invention there is described a connection component for a microelectronic element having a plurality of contact terminals arranged in an array, the component comprising a body of polymer material having opposing planar first and second surfaces, a plurality of elongated leads extending through the body between the first and second surfaces, the leads having a first end accessible at the first surface and a second end accessible at the second surface, a plurality of contacts on the first surface in electrical contact with the first ends of the leads, the plurality of contacts arranged in an array corresponding to the array of the plurality of contact terminal pads on the microelectronic element, and a layer of anisotropic conductive material overlying the first surface of the body and the plurality of contacts.

The aforesaid connection component further includes a layer of dielectric material on the second surface of the body and includes a plurality of conductors extending through the layer of dielectric material in electrical contact with the second ends of the leads, wherein the layer of anisotropic conductive material is provided on the first surface of the body and the layer of the anisotropic conductive material is further provided on the second surface of the body.

In accordance with another embodiment of the present invention there is described a microelectronic package comprising, a first microelectronic element having a front face including a plurality of contact terminals, a connector comprising a body of dielectric material having opposing first and second surfaces, the first surface facing the front face of the microelectronic element, a plurality of elongated leads extending through the body between the first and second surfaces, the leads having a first end accessible at the first surface and a second end accessible at the second surface, the first ends of the leads facing in alignment with the plurality of contact terminals on the first microelectronic element, and a layer of anisotropic conductive material between the front face of the microelectronic element and the first surface of the body, the anisotropic conductive material providing electrical continuity between the plurality of contact terminals and the leads.

The aforesaid microelectronic package further includes a plurality of contacts on the first surface in electrical contact with the first ends of the leads, wherein the dielectric material is flexible or rigid and the anisotropic conductive material is an adhesive material.

The aforesaid microelectronic package wherein the first and second ends of the leads are offset from each other and further including a plurality of contacts formed from a portion of the first ends of the leads, wherein the anisotropic conductive material is provided in the form of a paste or a preformed sheet.

The aforesaid microelectronic package wherein the layer of the anisotropic conductive material is provided on the first surface of the body and the first ends of the leads, and wherein the layer of the anisotropic conductive material is provided on the second surface of the body and the second ends of the leads and further including a layer of dielectric material on the first surface of the body, wherein the plurality of vias extend through the layer of dielectric material in electrical contact with the second ends of the leads.

The aforesaid microelectronic wherein the layer of anisotropic conductive material is provided on the front face of the first microelectronic element, wherein the first microelectronic element comprises a semiconductor chip, further including a second microelectronic element disposed on the second surface of the body, and wherein the second microelectronic element includes a plurality of second contact terminals connected to the second ends of the leads.

The aforesaid microelectronic package further comprising a second layer of anisotropic conductive material between the second microelectronic element and the second surface of the body, the second layer of anisotropic conductive material providing electrical continuity between the second contact terminals and the second ends, wherein the plurality of contact terminals are arranged in an array and the first ends of the leads are arranged in a corresponding array.

In accordance with another embodiment of the present invention there is described a method of making a connection component for a microelectronic element, the method comprising providing a body of dielectric material having opposing first and second surfaces and a plurality of elongated leads extending therethrough between the first and second surfaces, the leads having a first end accessible at the first surface and a second end accessible at the second surface, and providing a layer of anisotropic conductive material overlying the first ends and the first surface of the body for electrical connection to a microelectronic element.

The aforesaid method wherein the dielectric material is flexible or rigid and further includes forming the plurality of leads whereby the first and second ends are offset from each other.

The aforesaid method further including providing the layer of the anisotropic conductive material on the first surface of the body, further including providing the layer of the anisotropic conductive material on the second surface of the body, further including forming a plurality of contacts on the first surface in electrical contact with the first ends of the leads, further including providing a layer of dielectric material on the second surface of the body, further including providing a plurality of conductors extending through the layer of dielectric material in electrical contact with the second ends of the leads, and wherein the plurality of conductors comprise lined vias.

In accordance with another embodiment of the present invention there is described a method of making a microelectronic package, the method comprising providing a first microelectronic element having a front face including a plurality of first contact terminals, forming a body of dielectric material having opposing first and second surfaces and a plurality of elongated leads extending therethrough between the first and second surfaces, the leads having a first end accessible at the first surface and a second end accessible at the second surface, arranging the first surface of the body opposing the front face of the first microelectronic element, providing a layer of anisotropic conductive material between the front face of the microelectronic element and the first surface of the body, and adhering the first microelectronic element to the body whereby the anisotropic conductive material provides electrical continuity between the plurality of contact terminals and the leads.

The aforesaid method further including forming a plurality of contacts on the first surface in electrical contact with the first ends of the leads, the plurality of contacts arranged in alignment with the plurality of contact terminals, further including forming the plurality of leads whereby the first and second ends are offset from each other, wherein the layer of anisotropic conductive material is applied to the first surface of the body, wherein the layer of anisotropic conductive material is applied to the front face of the first microelectronic element.

The aforesaid method wherein the anisotropic conductive material is further applied to the second surface of the body, further including providing a layer of dielectric material on the second surface of the body, further including providing a plurality of conductors extending through the layer of dielectric material in electrical contact with the second ends of the leads.

The aforesaid method further including a second microelectronic element disposed on the second surface of the body, wherein the second microelectronic element includes a plurality of second contact terminals connected to the second ends of the leads, further including a layer of anisotropic conductive material on the second surface for electrically connecting the second ends of the leads to the plurality of second contact terminals, and further including a plurality of contacts integrally formed as a portion of the first ends of the leads adjacent the first surface. In accordance with another embodiment of the present invention there is described a connector for a microelectronic element, the connector comprising a body of dielectric material having opposing first and second surfaces, a plurality of elongated leads extending through the body between the first and second surfaces, the leads having a first end at the first surface and a second end at the second surface, and a layer of anisotropic conductive material overlying the first surface and the first ends of such leads.

The aforesaid connector wherein the anisotropic conductive material is applied on the first surface and wherein the anisotropic conductive material is provided in the form of a preformed sheet.

In accordance with another embodiment of the present invention there is described a microelectronic package comprising, a first microelectronic element having a front face including a plurality of first contact terminals, a printed circuit board having a front face including a plurality of second contact terminals, a connector comprising a body of dielectric material having opposing first and second surfaces, the first surface facing the front face of the microelectronic element, a plurality of elongated leads extending through the body between the first and second surfaces, the leads having a first end accessible at the first surface and a second end accessible at the second surface, the first ends of the leads facing in alignment with the plurality of contact terminals on the first microelectronic element, and a first layer of anisotropic conductive material between the front face of the microelectronic element and the first surface of the body, the anisotropic conductive material providing electrical continuity between the plurality of contact terminals and the leads, and the plurality of second contact terminals electrically connected to the second ends of the leads.

The aforesaid microelectronic package further includes a second layer of anisotropic conductive material provided between the front face of the printed circuit board and the second surface of the body, the anisotropic conductive material providing electrical continuity between the plurality of second contact terminals and the leads.

BRIEF DESCRIPTION OF THE DRAWINGS

The above description, as well as further objects, features and advantages of the present invention will be more fully understood with reference to the following detailed description of connection components with anisotropic conductive material interconnection, when taken in conjunction with the accompanying drawings, wherein:

FIGS. 5–10 are sequential front elevational views showing the steps in the process of making the connector shown in FIG. 3;

FIG. 11 is a front elevational view of a connector constructed in accordance with another embodiment of the present invention and in assembled relationship with a semiconductor chip using a layer of anisotropic conductive material;

FIG. 12 is a front elevational view of a connector constructed in accordance with one embodiment of the present invention in assembled relationship with first and second microelectronic elements using at least one layer of an anisotropic conductive material;

FIG. 13 is a front elevational view of a connector constructed in accordance with another embodiment of the present invention and in assembled relationship with first and second microelectronic elements using at least one layer of an anisotropic conductive material;

FIG. 14 is a front elevational view of a connector constructed in accordance with another embodiment of the present invention in assembled relationship with first and second microelectronic elements using at least one layer of an anisotropic conductive material;

FIG. 15 is a front elevational view of a connector constructed in accordance with another embodiment of the present invention in assembled relationship with first and second microelectronic elements using at least one layer of an anisotropic conductive material;

FIG. 16 is a front elevational view of a connector constructed in accordance with another embodiment of the present invention in assembled relationship with first and second microelectronic elements using at least one layer of an anisotropic conductive material; and FIG. 17 is a front elevational view of a connector constructed in accordance with another embodiment of the present invention in assembled relationship with first and second microelectronic elements using at least one layer of an anisotropic conductive material;

DETAILED DESCRIPTION OF PREFERRED EMBODIMENTS

In describing the preferred embodiments of the subject matter illustrated and to be described with respect to the drawings, specific terminology will be resorted to for the sake of clarity. However, the invention is not intended to be limited to the specific terms so selected, and is to be understood that each specific term includes all technical equivalence which operate in a similar manner to accomplish a similar purpose.

Figure 1:
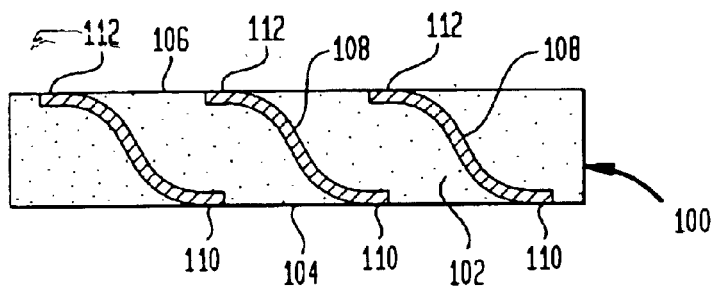
FIG. 1 is a front elevational view of a connector constructed in accordance with one embodiment of the present invention.

Referring now to the drawings, wherein like reference numerals represent like elements, there is shown in FIG. 1 a connector or connection component constructed in accordance with one embodiment of the present invention and generally designated by reference numeral 100. The connector 100 can be used to provide electrical connection between two microelectronic components, for example, a semiconductor chip, printed circuit board, circuit panel or other microelectronic device. Where the connector 100 is constructed from flexible or compliant materials, the connector can accommodate relative movement between the connected microelectronic components resulting from their thermal expansion and contraction.

The connector 100 is generally constructed from a body 102 of dielectric material having a generally planar first surface 104 and an opposing spaced apart generally planar second surface 106. A plurality of electrically conductive elongated leads extend through the body 102 between the first and second surfaces 104, 106. The leads 108 are provided with first ends 110 generally accessible at the first surface 104 and second ends 112 generally accessible at the second surface 106. The first and second ends of leads 108, in accordance with one embodiment, are offset from each other in horizontal direction, as shown in FIG. 1, to form an S-shaped profile. However, the leads may have other shaped profiles such as straight where the first and second ends 110, 112 are arranged generally overlying each other in collinear alignment such as disclosed in certain embodiments of the '964 Patent. The first and second ends 110, 112 of the leads 108 can be arranged in various patterns and matrices which may be the same or different as will be understood from the further description of the present invention.

Figure 2:
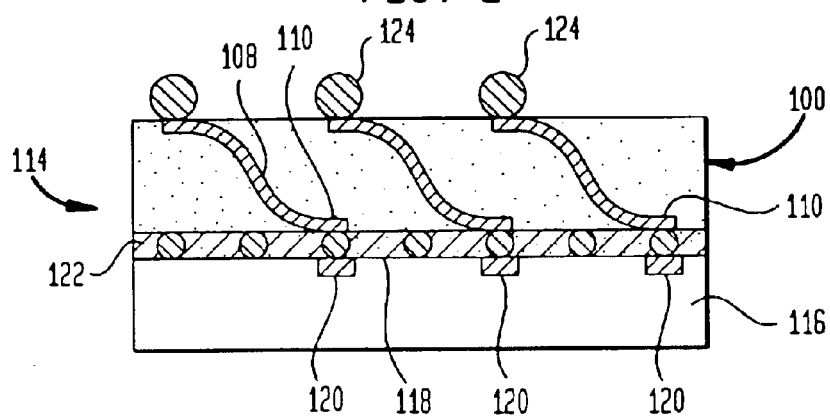
FIG. 2 is a front elevational view of the connector shown in FIG. 1 in assembled relationship with a semiconductor chip using a layer of anisotropic conductive material.

Referring now to FIG. 2, there is disclosed a microelectronic package 114 formed by electrically connecting a connector 100 to a microelectronic element such as a semiconductor chip 116. The semiconductor chip 116 has an exposed face 118 which includes a plurality of contact terminals 120 arranged in a predetermined array. The second ends 112 of the leads 108 are arranged in a corresponding array to the contact terminals 120. The second ends 112 form contacts for electrical connection to the contact terminals 120 of the semiconductor chip 116.

The connector 100 is adhered to the semiconductor chip 116 to provide electrical continuity between the contact terminals 120 and leads 108 by a layer of anisotropic conductive material 122 which in accordance with the preferred embodiment has adhesive properties. The material 122 in describing the following example will therefore be designated for illustration purposes as adhesive 122. The anisotropic conductive adhesive can be provided in the form of a paste or a preformed sheet. In this regard, the layer of anisotropic conductive adhesive 122 may be deposited onto the first surface 104 of the body 102 or the exposed face 118 of the semiconductor chip 116. As the anisotropic conductive adhesive 122 is electrically conductive only in the vertical direction, i.e., between the contact terminals 120 and first ends 110 of the leads 108, it is not required that the adhesive be stenciled in a pattern only over the contact terminals. In this regard, the anisotropic conductive adhesive 122, whether in paste or preformed sheet form, is generally applied over the entire first surface 104 of the connector 100 or the corresponding exposed face 118 of the semiconductor chip 116. The microelectronic package 114 can be electrically mounted to another microelectronic element such as a circuit panel by, for example, solder balls 124 which are attachable in electrical continuity to the second ends 112 of the leads 108 at the second surface 106 of the connector 100 or, for example, another layer of anisotropic conductive adhesive (not shown) at the second surface.

As shown in FIG. 2, the connector 100 is adhered to a semiconductor chip 116 by the adhesive properties of the anisotropic conductive material 122 in accordance with the preferred embodiment. However, it is not required that the anisotropic conductive material 122 have adhesive properties. In this regard, the periphery of the mating surfaces of the semiconductor chip 116 and connector 100 can be provided with an adhesive layer, such as a non-conductive adhesive, as well as at other locations which do not interfere with the conductive path between the ends of the leads 108 and contact terminals 120 on the semiconductor chip 116. In addition, other techniques can be used, for example, mechanical clamping, encapsulation of the connector 100 and semiconductor chip 116, and the like.

Figure 3:
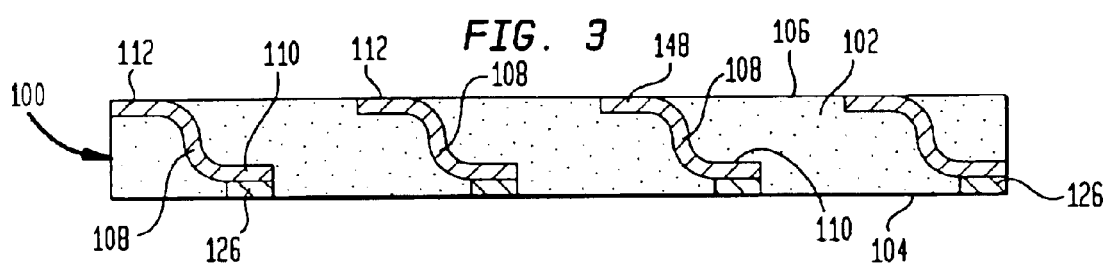
FIG. 3 is a front elevational view of a connector constructed in accordance with another embodiment of the present invention.
Figure 4:
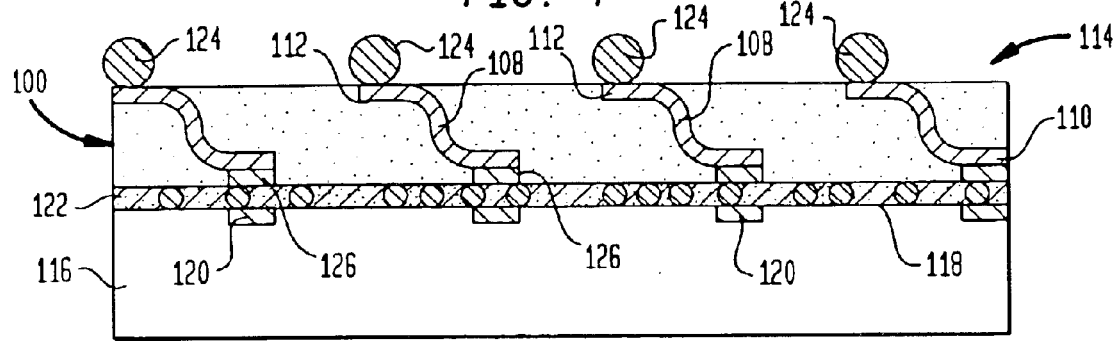
FIG. 4 is a front elevational view of the connector shown in FIG. 3 in assembled relationship with a semiconductor chip using a layer of anisotropic conductive material.
Figure 5:
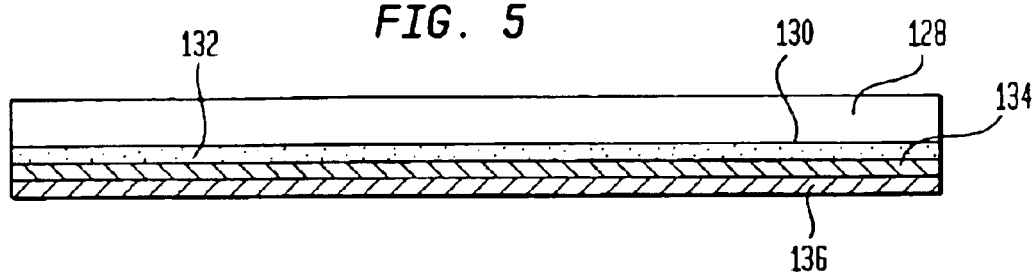
Figure 6:
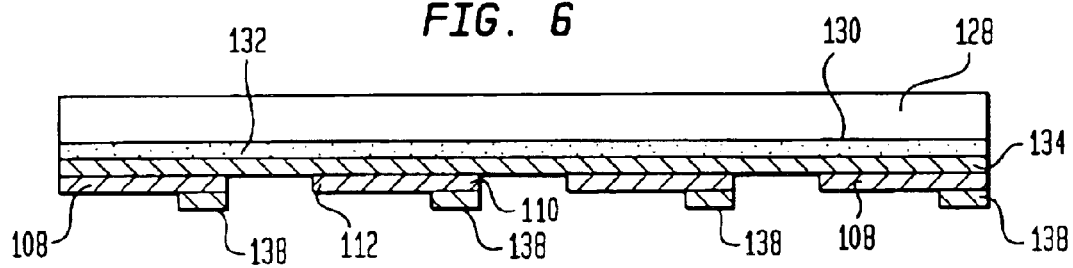

Referring to FIGS. 3 and 4, there is disclosed another embodiment of a connector 100 and microelectronic package 114 in accordance with the preferred embodiment of the present invention. As shown in FIG. 3, the connector 100 is formed with a plurality of individual electrically conductive contacts 126. The contacts 126 are formed in the first surface 104 of the body 102 in alignment with the first ends 110 of the leads 108. As will be described hereinafter, the first ends 110 of the leads 108 are attached to the contacts 126 to provide electrical continuity.

In other features, the connectors shown in FIGS. 1 and 3 are generally of similar construction. The contacts 126 are electrically connected to the contact terminals 120 of the semiconductor chip 116 using the anisotropic conductive adhesive 122 as thus far described with respect to the microelectronic package 114 in FIG. 2. It can therefore be appreciated that connectors 100 and microelectronic packages 114 can be constructed either with or without separate contacts 126.

Turning now to FIGS. 5-10, there will be described a method of making a connector 100 in accordance with the preferred embodiment of the present invention. A planar substrate 128 which functions as a mandrill is provided with a generally planar surface 130. The substrate 128 can be formed from a variety of rigid materials such as borosilicate glass, aluminum and the like. A layer of releasable adhesive 132, such as, for example a heat or UV releasable adhesive, is applied over the surface 130 of the substrate 128. A sacrificial sheet of an electrically conductive material 134, such as aluminum foil, is laminated onto the adhesive layer 132. It being contemplated that other materials for the sacrificial layer 134 such as chrome, nickel, alloys or combinations thereof, or other electrically conductive metals which are capable of being selectively etched with respect to the metal of the copper layer 136, can be provided on the adhesive layer 132. By any suitable means, a copper layer 136 is formed on the aluminum layer 134. The copper layer 136 may be formed by known processes such as lamination, sputtering or electroless plating followed by electroplating.

The exposed copper layer 136 is circuitized to form the desired features of the connector 100 such as leads 108, circuit traces, bonding pads, solder ball pads and the like. In this regard, the first ends 110 of the leads 108 can function as bonding pads while the second ends 112 of the leads can function as solder ball pads. The first ends 110 of the leads 108 can be arranged in an array corresponding to the array of the contact terminals 120 on the semiconductor chip 116. In one embodiment, the first ends 110 can be arranged in an area array, i.e., an array of features arranged in a substantially regular pattern with a substantially uniform density of features throughout the horizontal extent of the pattern. Similarly, the second ends 112 of the leads 108 can be arranged in an array corresponding to the array of the contact terminals of the microelectronic element to which the second ends are to be electrically attached via the solder balls 124. The leads 108, as well as the other circuit features can be formed from the copper layer 136, by way of one example only, by conventional photographic processes. It is to be understood that the leads 108 may be fabricated from essentially any conductive material, but most typically being formed from conductive metals such as copper, copper alloys, gold, gold alloys and composites including layers of these metals. The leads 108 are made peelable from the aluminum layer 134 using any one of a number of conventional processes as to be described hereinafter.

Figure 7:
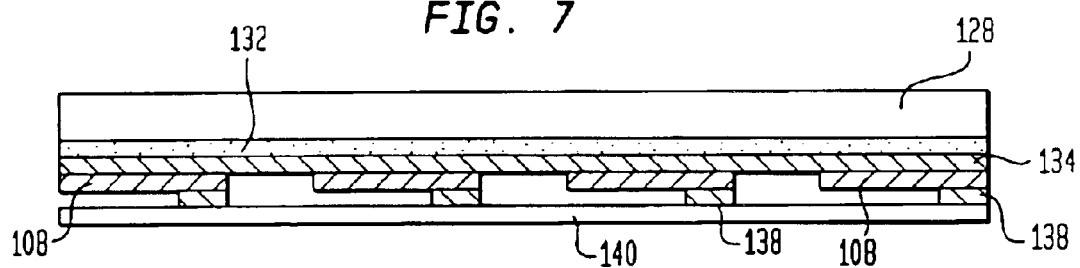

A fusible metal such as a tin/lead alloy is selectively plated onto the first ends 110 of the leads 108 to form a plurality of conductive contacts 138. If desired, the contacts 138 may be overplated with a non-oxidizable metal layer, for example, gold. The contacts 138 are bonded to a temporary support 140 such as a sheet of solder-wettable metal such as copper, copper alloys and the like. The resulting structure, as shown in FIG. 7, is subject to vertical expansion through, for example, separation of vacuum platens or pressurized injection of an elastomeric encapsulant.

Figure 8:
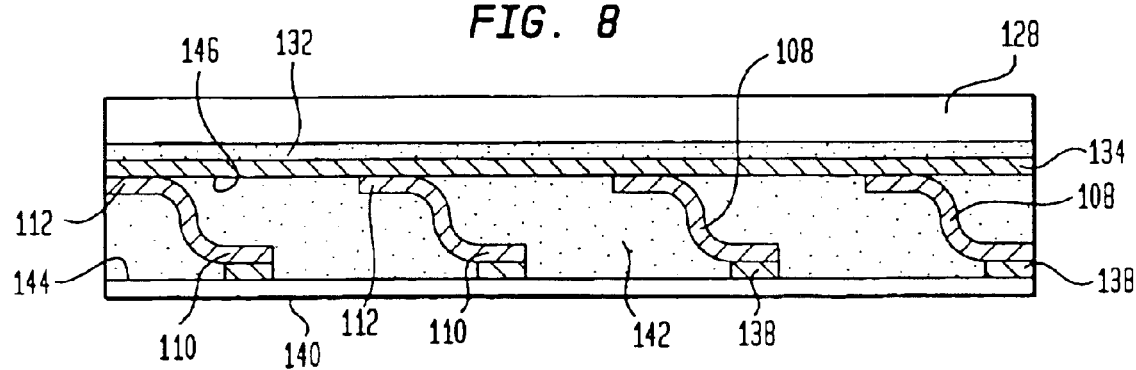

Further in this regard, the temporary support 140 and the substrate 128 are moved vertically away from one another through a predetermined displacement, and horizontally relative to one another, so that the first end 112 of the lead 108 moves horizontally toward and vertically away from the first end 110 of the lead. To this end, the temporary support 140 may be engaged with a lower platen while the substrate 128 may be engaged with an upper platen. The engagement may be maintained by applying a vacuum through each of the platens to hold the substrate 128 and temporary support 140 firmly in engagement with the platens as the platens are moved away from one another. The relative movement of the lead ends 110, 112 bend the main portion of the lead 108. Continued vertical and horizontal movement of the temporary support 140 and substrate 128 causes the lead 108 to buckle and form a generally S-shaped configuration as shown in FIG. 8. Horizontal movement is preferred, but optional, as you can still produce the S-shape of the leads if one starts with the leads 108 which are curved in the horizontal plane before the vertical displacement.

During or after movement of the temporary support 140 from the substrate 128, a flowable material such as a liquid composition 142 capable of curing to form a compliant dielectric material such as a gel or an elastomer is injected between the temporary support 140 and aluminum layer 134. For example, the curable liquid composition 142 may be a silicone or epoxy composition which forms a compliant flexible body. On the other hand, it is also contemplated that the curable liquid composition 142 may be in the nature of a rigid polymer material if desired. If the liquid composition 142 is injected during the movement step, the pressure of the flowable composition will help to force the temporary support 140 and substrate 128 away from each other, either with or without assistance from the platens. The liquid composition 142 is then cured to form a compliant dielectric layer having a first surface 144 formed in contact with the temporary support 140 and a second surface 146 formed in contact with the sacrificial aluminum layer 134.

As shown in FIG. 9, the temporary support 140 is removed by, for example, reflowing the fusible metal forming the contacts 138. The temporary support 140 may be removed by other techniques such as ablation, plasma or wet chemical etching. However, the latter methods will require that the temporary support 140 be constructed of a material whose etchant will not attack the remaining structure of the connector 100, such as the contacts 138, leads 108, etc. The resulting structure as shown in FIG. 9 is further released from the temporary support 128 by heating or application of UV radiation to release the adhesive layer 132.

The sacrificial aluminum layer 134 is etched away using a suitable etchant, leaving the second ends 112 forming solder ball pads 148 exposed on the second surface 106. Conductive metal such as copper, copper gold alloy and the like may be plated onto the exposed surface of the solder ball pads 148 if desired to enhance bonding of the solder balls 124. Residual fusible material on the contacts 138 can be etched away when etching the aluminum sacrificial layer 134 using a suitable etchant such as hydrochloric acid. The resulting connector 100 is illustrated in FIG. 3 as previously described. It is to be understood that the contacts 138 are not an essential component of the connector 100. In this regard, the contacts 138 may be omitted during the manufacturing process to produce the connector 100 as shown in FIG. 1. In this regard, the first ends 110 of the leads 108 adjacent the first surface 104 of the body 102 will function as contacts for joining with the contact terminals 120 of the semiconductor chip 116. The first ends 110 of the leads 108 can be joined to the temporary support 140 by stenciling fusible material thereon, and later removing same by chemical etching.

The anisotropic conductive adhesive 122 is provided as a continuous preformed sheet or layer in the form of a paste which is provided over substantially all of the contacts 126, 138 and exposed first surface of the body 102. The anisotropic conductive adhesive 122 can alternatively be applied over exposed face 118 of the semiconductor chip 116. The anisotropic conductive adhesive 122 is preferably a polymeric resin having a matrix of conductive particles therein, such as the conductive particles as shown in FIG. 2. The anisotropic conductive adhesive 122, need not be flexible and/or compliant such as preferred with respect to the composition 142 forming the body 102. In this regard, the anisotropic conductive adhesive 122 may be formed in the nature of a rigid layer.

By the application of pressure, the anisotropic conductive adhesive 122 becomes conductive in the pressed direction due to the continuity of the conductive material, for example, the metallic powders, caused by the pressure. The conductive particles may include metallic powders such as nickel or gold. The metallic powders may also be, for example, metallic particles consisting of resin particles coated with Ni-plated layers or the like, or solid metallic particles consisting of gold, nickel or the like. The particles may, for example, be in the size range of from about 3 to 15 microns, preferably as solid balls of nickel or gold. One suitable anisotropic conductive material includes the material sold under the tradename "FC-262B" by the Hitachi Chemical Company. The exact composition and characteristics of the FC-262B anisotropic conductive material are set forth in more detail in the chemical data sheet for the FC-262B material, which is incorporated herein by reference.

There are a number of advantages associated with using an anisotropic conductive adhesive 122 for electrically connecting the flexible leads 108 and chip contacts 120. First, there is no metal-to-metal ("intermetallic") bonding requiring the use of high temperatures/pressures during thermocompression or thermosonic bonding. In addition, when using an anisotropic conductive adhesive 122 to attach the leads 108 to the contacts 120, lower temperatures and pressures will be required to make the connections. The lower temperatures and pressures will minimize stresses on the connector 100 which, in turn, will minimize the potential for the fatigue related problems. Another benefit of bonding at lower temperatures and pressures is that finer flexible leads 108 may be used which will enable even finer pitches to be obtained (i.e., more leads in the same space).

Referring now to FIG. 11, there is shown a modified form of the connector 100 in accordance with another embodiment of the present invention. The connector 160 includes a layer 162 generally in the nature of a single layer of dielectric material such as a polyimide. Although the layer 162 is illustrated as including only a single layer of dielectric material, it should be appreciated that it can include other features such as multiple dielectric layers, electrically conductive traces extending in horizontal directions along the surfaces of the body or within the body, electrically conductive ground planes or power planes also extending in a horizontal direction on a surface of the body within the body, as well as electrically conductive vias connecting these features with one another. In this regard, a plurality of vias 164, lined with an electrically conductive material, such as copper, extend through the layer 162 into electrical connection with the leads 108.

It is contemplated that the first and second ends 110, 112 of the leads 108 can be redistributed on the first and second surfaces 104, 106 of the connector 100, 160. Redistribution can be achieved, by way of example, using conductive traces which extend to the desired location for redistributing the pattern or matrix of the first and second ends of the leads 108. The conductive traces (not shown) can be preformed on the dielectric body 102 using conventional techniques, for example, a patterned photomask followed by conductive metal deposition, e.g., sputtering, followed by electroless and/or electroplating. Thus, the solder balls 124 as shown in FIG. 11 can be at any location desired so as to mate with conductive terminals on a microelectronic element such as a printed circuit board or other semiconductor chip and the like. The conductive traces can be electrically connected to the vias.

The connector 160 can be made in accordance with the methods as thus far described, wherein the dielectric layer 162 is used in place of the sacrificial aluminum layer 134. In addition, the dielectric layer 162 may be applied to the second surface 106 of the body 102 after manufacture, as well as being an integral part of the manufacturing processes as disclosed in the '694 Patent, the disclosure of which is incorporated herein by reference.

As previously described, the leads 108 are made peelable from the sacrificial aluminum layer 134 or dielectric layer 162 using a variety of techniques. For example, prior to the expansion step, i.e., between FIGS. 7 and 8, the sacrificial aluminum layer 134 can be subjected to a selective etchant process by exposing portions of the aluminum layer to a liquid etch solution which attacks the layer so as to undercut the leads 108 and remove the sacrificial aluminum layer from beneath the etch resistant leads at all locations except at their second ends 112. At the second ends 112, most, but not all of the sacrificial aluminum layer is removed. This method of forming peelable leads is further disclosed in the '964 Patent which is incorporated herein by reference. Other methods for forming peelable leads which can be used in practicing the present invention are disclosed in commonly assigned U.S. Pat. No. 5,763,941, entitled, "Connection Component With Releasable Leads"; U.S. patent application Ser. No. 09/549,638 entitled, "Components With Releasable Leads", filed on Apr. 14, 2000; U.S. patent application Ser. No. 09/200,100 entitled "Connection Component With Peelable Leads", filed on Nov. 25, 1998; and U.S. patent application Ser. No. 09/566,273 entitled "Components With Releasable Leads", filed on May 5, 2000, the disclosures of which are incorporated herein by reference.

Referring to FIG. 12, there is shown a microelectronic package generally designated by reference numeral 170. The microelectronic package 170 is provided with a pair of microelectronic elements 172, 174. As previously noted, the microelectronic elements 172, 174 may include, for example, semiconductor chips, printed circuit boards, circuit panels, other microelectronic devices and the like. The microelectronic element 172 is electrically connected to the leads 108 using a layer of conductive anisotropic material 122 preferably having adhesive properties. The face of the microelectronic element 172 can be provided with a plurality of contact terminals (not shown) arranged in the appropriate matrix or array.

A second microelectronic element 174 is similarly electrically mounted for electrical connection to the leads 108 on the other surface of the connector 100 using a layer of anisotropic conductive material 122. Solder balls 124 may be provided in contact with the ends of the leads 108 which are exposed on either side of the microelectronic element 174. It is preferred that the height of the solder balls 124 be larger than the combined height of the anisotropic conductive material 122 and microelectronic element 174. This enables the microelectronic package 170 to be bonded to another microelectronic element such as a printed circuit board via the solder balls 124.

Referring to FIG. 13, there is disclosed a microelectronic package 176 constructed in accordance with another embodiment of the present invention. In this regard, the ends of the leads 108 are redistributed to allow the microelectronic element 174 to be wire bonded via the conductive wires 178. The microelectronic element 174 and surrounding bond wires 178 are encapsulated by, for example, overmolding with a polymer material, which may be rigid or flexible. Preferably, the encapsulant is a dielectric material.

Turning to FIG. 14, there is disclosed another embodiment of a microelectronic package 182. The microelectronic element 172 is in the nature of a bump chip having a plurality of contact terminals 184. The contact terminals 184 are in electrical continuity with the free ends of the leads 108 via the anisotropic conductive material 122. The microelectronic element 174 via the anisotropic conductive material 122 is in electrical continuity with redistributed leads on the surface of a flexible polyimide layer 185. The polyimide layer 185 is provided with a plurality of plated through vias 164 for electrical connection to the ends of the leads 108. The solder balls 124 are in direct electrical connection to the vias 164 which provide continuity to the ends of the leads 104.

Referring to FIG. 15, there is shown another embodiment of a microelectronic package 186. The package 186 is provided with a dielectric polyimide layer 185 which is rigid and extends beyond the periphery of the connector 100, and may include a plurality of plated through vias 164. The resulting package is encapsulated with an encapsulant 188 similar to the encapsulant 180 as previously described. The larger dielectric layer 185 allows for the arrangement of a greater number of solder balls 124 for interconnection to another microelectronic element.

Turning to FIG. 16, there is shown a microelectronic package 190 constructed in accordance with another embodiment of the present invention. The microelectronic element 174 is connected to the connector 100 via a second connector 192 comprising a plurality of leads 194 embedded in a compliant layer 196. The leads 194 may be in alignment with for direct electrical connection to the ends of the leads 108 as shown in the left hand portion of the connector 192. As also shown, the ends of the leads 108 may be redistributed for connection to the ends of the leads 194 as shown in the right hand portion of the connector 192. The second connector 192 can be constructed in a similar manner as connector 100. However, it is to be understood that other methods of forming the connector 192 can be used. In addition, a layer of anisotropic conductive material may be sandwiched between the first and second connectors 100, 192.

Turning to FIG. 17, there is shown a microelectronic package 196 constructed in accordance with another embodiment of the present invention. As shown, the microelectronic element 174 is in the nature of a bump chip or flip chip having a plurality of conductive bumps 198 thereon. The ends of the leads 108 on the surface of the connector 100 may be redistributed if necessary into an array corresponding to an array of the bumps 198

Although the invention herein has been described with reference to particular embodiments, it is to be understood that these embodiments are merely illustrative of the principles and application of the present invention. It is therefore to be understood that numerous modifications may be made to the illustrative embodiments and that other arrangements may be devised without departing from the spirit and scope of the present invention as defined by the appended claims.

What is claimed is:

1. A connection component for a microelectronic element, said component comprising a body of dielectric material having opposing first and second surfaces,
a plurality of elongated leads extending through said body between said first and second surfaces, said leads having a first end accessible at said first surface and a second end accessible at said second surface, and
a layer of anisotropic conductive material overlying said first ends and said first surface of said body for electrical connection of said leads to a microelectronic element.

2. The connection component of claim 1, wherein said dielectric material is flexible.

3. The connection component of claim 1, wherein said dielectric material is rigid.

4. The connection component of claim 1, wherein said first and second ends of said leads are offset from each other.

5. The connection component of claim 1, further including a plurality of contacts on said first surface in electrical contact with said first ends of said leads.

6. The connection component of claim 5, wherein said plurality of contacts are formed from a portion of said first ends of said leads.

7. The connection component of claim 1, wherein said anisotropic conductive material is provided in the form of a paste.

8. The connection component of claim 1, wherein said anisotropic conductive material is provided in the form of a preformed sheet.

9. The connection component of claim 1, wherein said layer of said anisotropic conductive material is provided on said first surface of said body.

10. The connection component of claim 1, wherein said anisotropic conductive material is an adhesive material.

11. The connection component of claim 1, further including a layer of dielectric material on said second surface of said body.

12. The connection component of claim 11, further including a plurality of conductors extending through said layer of dielectric material in electrical contact with said second ends of said leads.

13. The connection component of claim 12, wherein said plurality of conductors comprise lined vias.

14. The connection component of claim 1, wherein said layer of anisotropic conductive material is provided on said first surface of said body and said first ends of said leads.

15. The connection component of claim 14, wherein said layer of anisotropic conductive material is provided on said second surface of said body and said second ends of said leads.

16. The connection component of claim 1, wherein said first ends are horizontally displaced from said second ends.

17. A connection component for a microelectronic element having a plurality of contact terminals arranged in an array,
said component comprising a body of polymer material having opposing planar first and second surfaces,
a plurality of elongated leads extending through said body between said first and second surfaces, said leads having a first end accessible at said first surface and a second end accessible at said second surface,
a plurality of contacts on said first surface in electrical contact with said first ends of said leads, said plurality of contacts arranged in an array corresponding to the array of said plurality of contact terminal pads on said microelectronic element, and
a layer of anisotropic conductive material overlying said first surface of said body and said plurality of contacts.

18. The connection component of claim 17, further including a layer of dielectric material on said second surface of said body.

19. The connection component of claim 18, further including a plurality of conductors extending through said layer of dielectric material in electrical contact with said second ends of said leads.

20. The connection component of claim 17, wherein said layer of anisotropic conductive material is provided on said first surface of said body.

21. The connection component of claim 20, wherein said layer of said anisotropic conductive material is further provided on said second surface of said body.

22. The connection component of claim 17, wherein said anisotropic conductive material is an adhesive material.

23. A microelectronic package comprising,
a first microelectronic element having a front face including a plurality of contact terminals,
a connector comprising a body of dielectric material having opposing first and second surfaces, said first surface facing said front face of said microelectronic element, a plurality of elongated leads extending through said body between said first and second surfaces, said leads having a first end accessible at said first surface and a second end accessible at said second surface, said first ends of said leads facing in alignment with said plurality of contact terminals on said first microelectronic element, and
a layer of anisotropic conductive material between said front face of said microelectronic element and said first surface of said body, said anisotropic conductive material providing electrical continuity between said plurality of contact terminals and said leads.

24. The microelectronic package of claim 23, further including a plurality of contacts on said first surface in electrical contact with said first ends of said leads.

25. The microelectronic package of claim 23, wherein said dielectric material is flexible.

26. The microelectronic package of claim 23, wherein said dielectric material is rigid.

27. The microelectronic package of claim 23, wherein said anisotropic conductive material is an adhesive material.

28. The microelectronic package of claim 23, wherein said first and second ends of said leads are offset from each other.

29. The microelectronic package of claim 23, further including a plurality of contacts formed from a portion of said first ends of said leads.

30. The microelectronic package of claim 23, wherein said anisotropic conductive material is provided in the form of a paste.

31. The microelectronic package of claim 23, wherein said anisotropic conductive material is provided in the form of a preformed sheet.

32. The microelectronic package of claim 23, wherein said layer of said anisotropic conductive material is provided on said first surface of said body and said first ends of said leads.

33. The microelectronic package of claim 32, wherein said layer of said anisotropic conductive material is provided on said second surface of said body and said second ends of said leads.

34. The microelectronic package of claim 23, further including a layer of dielectric material on said first surface of said body.

35. The microelectronic package of claim 34, further including a plurality of vias extending through said layer of dielectric material in electrical contact with said second ends of said leads.

36. The microelectronic package of claim 23, wherein said layer of anisotropic conductive material is provided on said front face of said first microelectronic element.

37. The microelectronic package of claim 23, wherein said first microelectronic element comprises a semiconductor chip.

38. The microelectronic package of claim 23, further including a second microelectronic element disposed on said second surface of said body.

39. The microelectronic package of claim 38, wherein said second microelectronic element includes a plurality of second contact terminals connected to said second ends of said leads.

40. The microelectronic package of claim 38, further comprising a second layer of anisotropic conductive material between the second microelectronic element and said second surface of said body, said second layer of anisotropic conductive material providing electrical continuity between said second contact terminals and said second ends.

41. The microelectronic package of claim 23, wherein said dielectric material comprises a polymer.

42. The microelectronic package of claim 23, wherein said plurality of contact terminals are arranged in an array and said first ends of said leads are arranged in a corresponding array.

43. A connector for a microelectronic element, said connector comprising a body of dielectric material having opposing first and second surfaces, a plurality of elongated leads extending through said body between said first and second surfaces, said leads having a first end at said first surface and a second end at said second surface, and a layer of anisotropic conductive material overlying said first surface and said first ends of such leads.

44. The connector of claim 43, wherein said anisotropic conductive material is applied on said first surface.

45. The connector of claim 43, wherein said anisotropic conductive material is provided in the form of a preformed sheet.

46. A microelectronic package comprising,
a first microelectronic element having a front face including a plurality of first contact terminals,
a dielectric layer having a front face including a plurality of second contact terminals,
a connector comprising a body of dielectric material having opposing first and second surfaces, said first surface facing said front face of said microelectronic element, a plurality of elongated leads extending through said body between said first and second surfaces, said leads having a first end accessible at said first surface and a second end accessible at said second surface, said first ends of said leads facing in alignment with said plurality of contact terminals on said first microelectronic element, and
a first layer of anisotropic conductive material between said front face of said microelectronic element and said first surface of said body, said anisotropic conductive material providing electrical continuity between said plurality of first contact terminals and said leads, and said plurality of second contact terminals electrically connected to said second ends of said leads.

47. The microelectronic package of claim 46, wherein a second layer of anisotropic conductive material is provided between said front face of said dielectric layer and said second surface of said body, said anisotropic conductive material providing electrical continuity between said plurality of second contact terminals and said leads.

48. The microelectronic package of claim 46, wherein said dielectric layer comprises a printed circuit board.

49. The microelectronic package of claim 46, wherein said dielectric layer includes at least an electrically conductive via extending therethrough in electrical connection with at least one of said second ends of said leads.

50. The microelectronic package of claim 46, further including a second microelectronic element having a front surface facing said dielectric layer and a second layer of anisotropic conductive material provided therebetween.

51. The microelectronic package of claim 46, wherein said dielectric layer includes a microelectronic element.

* * * * *

UNITED STATES PATENT AND TRADEMARK OFFICE
CERTIFICATE OF CORRECTION

| | | |
|---|---|---|
| PATENT NO. | : 6,825,552 B2 | Page 1 of 1 |
| APPLICATION NO. | : 10/139169 | |
| DATED | : November 30, 2004 | |
| INVENTOR(S) | : David Light, Paula Lagattuta Tostado and Michael Warner | |

It is certified that error appears in the above-identified patent and that said Letters Patent is hereby corrected as shown below:

Column 18, line 50, "includes a microelectronic" should read -- includes another microelectronic --.

Signed and Sealed this

Twelfth Day of June, 2007

JON W. DUDAS
*Director of the United States Patent and Trademark Office*